(12) United States Patent
Liu et al.

(10) Patent No.: US 11,263,420 B2
(45) Date of Patent: Mar. 1, 2022

(54) ELECTRONIC DEVICE AND MANUFACTURING METHOD THEREOF

(71) Applicant: InnoLux Corporation, Miao-Li County (TW)

(72) Inventors: Yu-Tsung Liu, Miao-Li County (TW); Hui-Ching Yang, Miao-Li County (TW); Te-Yu Lee, Miao-Li County (TW); Tao-Sheng Chang, Miao-Li County (TW); Ting-Yeh Chi, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/133,556

(22) Filed: Dec. 23, 2020

(65) Prior Publication Data
US 2021/0216744 A1      Jul. 15, 2021

(30) Foreign Application Priority Data
Jan. 15, 2020   (CN) .......................... 202010042607.1

(51) Int. Cl.
*G06K 9/00*       (2006.01)
*G06F 3/041*      (2006.01)

(52) U.S. Cl.
CPC ....... *G06K 9/00013* (2013.01); *G06F 3/0412* (2013.01); *G06F 3/0416* (2013.01)

(58) Field of Classification Search
None
See application file for complete search history.

(56) References Cited

U.S. PATENT DOCUMENTS

2018/0060641 A1* 3/2018 Kim ................... G06K 9/00013
2018/0233531 A1* 8/2018 Huang .............. H01L 27/14678

FOREIGN PATENT DOCUMENTS

CN            106709455 A      5/2017

OTHER PUBLICATIONS

English machine translation of Chinese patent publication CN 106709455 A (Year: 2017).*

* cited by examiner

*Primary Examiner* — Nicholas J Lee
(74) *Attorney, Agent, or Firm* — Winston Hsu

(57) ABSTRACT

An electronic device and a manufacturing method for the electronic device are provided. The electronic device includes a display structure layer and a light sensing panel. The light sensing panel includes a first substrate; a second substrate, wherein the second substrate is disposed between the first substrate and the display structure layer; a plurality of sensing units, disposed on the first substrate and between the first substrate and the second substrate; and an optical structure layer, disposed on the second substrate and between the second substrate and the display structure layer.

18 Claims, 8 Drawing Sheets

ELECTRONIC DEVICE AND MANUFACTURING METHOD THEREOF

BACKGROUND OF THE DISCLOSURE

1. Field of the Disclosure

The disclosure relates to an electronic device and manufacturing method thereof, and more particularly, to an electronic device with a light sensing element and manufacturing method thereof.

2. Description of the Prior Art

Nowadays, electronic devices, such as display devices, not only need to have display functions, but also need to have other functions such as touch or recognition functions. Therefore, it is desirable to provide a novel electronic device having a sensing function to improve the sensitivity of the sensor such as fingerprint recognition sensor and the sharpness of fingerprint imaging.

SUMMARY OF THE DISCLOSURE

The disclosure provides an electronic device with a light sensing element and manufacturing method thereof.

The disclosure discloses an electronic device. The electronic device includes a display structure layer and a light sensing panel. The light sensing panel includes a first substrate; a second substrate, wherein the second substrate is disposed between the first substrate and the display structure layer; a plurality of sensing units, disposed on the first substrate and between the first substrate and the second substrate; and an optical structure layer, disposed on the second substrate and between the second substrate and the display structure layer.

The disclosure further discloses a manufacturing method for an electronic device. The manufacturing method includes providing a first substrate, to forma plurality of sensing units on the first substrate; providing a second substrate, to dispose the second substrate on the first substrate; forming an optical structure layer on the second substrate, wherein the second substrate is disposed between the plurality of sensing units and the optical structure layer; and disposing a display structure layer on the optical structure layer These and other objectives of the present disclosure will no doubt become obvious to those of ordinary skill in the art after reading the following detailed description of the embodiment that is illustrated in the various figures and drawings.

DETAILED DESCRIPTION

Figure 1:
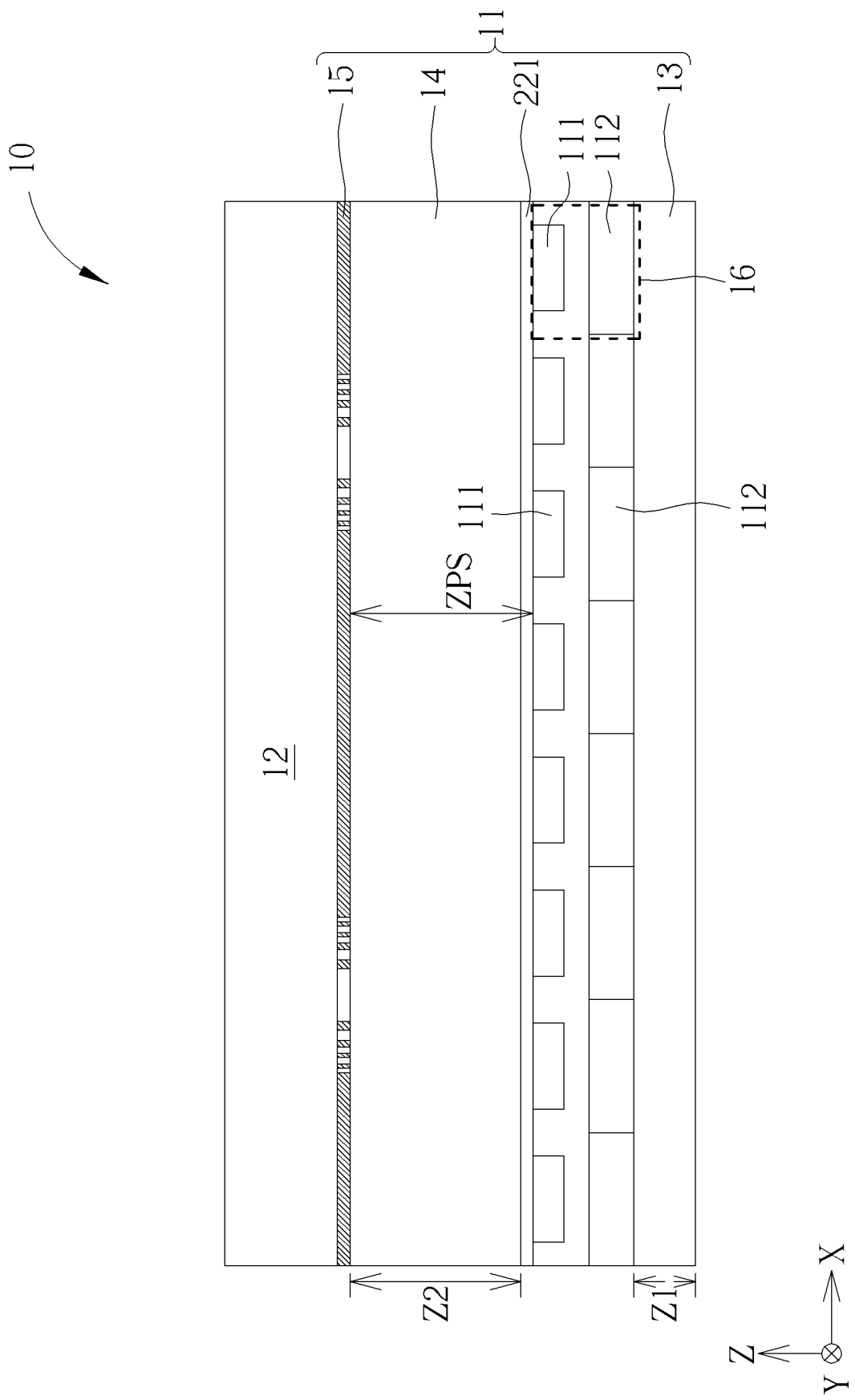
FIG. 1 is a schematic diagram of a cross-sectional view of an electronic device according to an embodiment of the disclosure.

The disclosure can be understood by referring to the following detailed description in conjunction with the accompanying drawings. It should be noted that, in order to make the readers easy to understand and for the simplicity of the drawings, the multiple drawings in the disclosure only illustrate a part of the electronic device. And the specific components in the drawings are not drawn according to actual scale. In addition, the number and size of each component in the figure are only for illustration, and are not used to limit the scope of the disclosure.

In the specification and the claims appended of the disclosure, certain terms will be used to refer to particular components. Those skilled in the art should understand that electronic device manufacturers may refer to the same components by different names. This article does not intend to distinguish between components that have the same function but different names.

The term "comprising" as used throughout the specification and subsequent claims is an open-ended fashion and should be interpreted as "including but not limited to".

It should be understood that when a component or film layer is referred to as being "on" or "connected" to another component or film layer, the component or film layer can be directly on or directly connected to this other component or film layer, or there is an inserted component or film layer between the two (indirect case). Conversely, when a component is said to be "directly" on or "directly connected to" another component or film layer, there is no intervening component or film layer between the two.

It should be understood that when a component or element is referred to as being "coupled" to another component or element, it can be directly connected to the other component or element, or there may be intervening components or elements between the two (indirectly). In addition, the term "couple" includes any direct and indirect electrical connection means.

Although the terms first, second, third . . . can be used to describe various components, the components are not limited to these terms. These terms are only used to distinguish a single component from other components in the specification. The same terms may not be used in the claims, and are replaced with first, second, third . . . according to the order declared in the claims. Therefore, in the following description, the first component may be the second component in the claims.

It should be noted that the following embodiments can replace, reorganize, and mix the technical features of several different embodiments without departing from the spirit of the disclosure to complete other embodiments.

FIG. 1 is a schematic diagram of a cross-sectional view of an electronic device 10 according to an embodiment of the disclosure. The electronic device 10 may be an electronic device with a biometric recognition function, such as a mobile phone, a tablet computer, and the like. The electronic device 10 includes a light sensing panel 11 and a display structure layer 12. The light sensing panel 11 includes a substrate 13, a substrate 14 disposed opposite to the substrate 13, an optical structure layer 15 and a plurality of sensing units 16. The sensing units 16 can be used for a fingerprint sensor, an iris sensor, a retina sensor, a face sensor, a vein sensor, a movement sensor, a gesture sensor, a proximity sensor or other suitable sensors, but the disclosure is not limited thereto. The following embodiment utilizes a fingerprint sensor as an example, but the disclosure is not limited thereto. The sensing unit 16 may further include a plurality of photodiodes 111 and sensing circuits 112 corresponding to the photodiodes 111, and the photodiodes 111 are electrically connected to the corresponding sensing circuits 112. The optical structure layer 15 may include, for example, a lens, an aperture, or a combination of a lens and an aperture, but is not limited thereto. The optical structure layer 15 can be formed by etching or a patterning process. A material of the optical structure layer 15 may include metal or light shielding material, but is not limited thereto.

The plurality of sensing units 16 are disposed on the substrate 13 and between the substrate 13 and the substrate 14. The substrate 14 is disposed on the substrate 13 and between the plurality of sensing units 16 and the optical structure layer 15. The optical structure layer 15 is disposed on the substrate 14 and between the display structure layer 12 and the substrate 14. The display structure layer 12 is disposed on the optical structure layer 15.

Please continue to refer to FIG. 1, for example, an alignment layer 221, a medium layer (not shown), and another alignment layer (not shown) may further be included between the substrate 13 and the substrate 14 of the electronic device 10, wherein the material of the medium layer may include a liquid crystal material or other transparent materials. Because the design of FIG. 1 may make a distance between the optical structure layer 15 formed on the substrate 14 and the sensing unit 16 (for example, a maximum distance ZPS from a lower surface of the optical structure layer 15 to an upper surface of an upper electrode (not shown) of the sensing unit 16) can be, for example, in a range of 150 micrometers to 250 micrometers. The design of FIG. 1 may improve the sharpness of imaging and increase the sensitivity of the sensor.

A size Z1 of the substrate 13 in a direction Z is, for example, 0.5 mm, and a size Z2 of the substrate 14 in the direction Z is, for example, 0.5 mm. The size Z1 and the size Z2 can be, for example, thicknesses of the substrate 13 and the substrate 14. In this embodiment, the size Z1 and size Z2 do not include layers other than the substrates. After the substrate 13 and the substrate 14 are combined, the size Z1 and the size Z2 are reduced (e.g., the size Z1, and size Z2 are reduced to 0.3 mm) to meet thin design requirements and improve sensitivity of the sensing units 16, wherein the method for reducing the size Z1 and the size Z2 may be chemical etching or physical polishing, or using etching and physical polishing in stages, but is not limited to this. In one embodiment, after the optical structure layer 15 is formed on the substrate 14, the size Z1 can be reduced again (for example, the size Z1 is reduced to 0.1 mm) to meet the thin design requirements. In one embodiment, a sum of the size Z1 and the size Z2 is greater than or equal to 0.4 mm, for example, so that the light sensing panel 11 can have sufficient supporting strength to increase the yield rate. In this way, the disclosure may meet thin design requirements, and may also improve the yield rate of the semiconductor process to reduce manufacturing costs.

A direction X, a direction Y and a direction Z are marked in FIG. 1. The direction Z may be perpendicular to the upper surface or the lower surface of the substrate 13 or the substrate 14, and the direction X and the direction Y may be parallel to the upper surface or the lower surface of the substrate 13 or the substrate 14. The direction Z may be perpendicular to the direction X and the direction Y, and the direction X may be perpendicular to the direction Y. The subsequent drawings can describe the spatial relationship of the structure according to the direction X, the direction Y, and the direction Z.

Figure 2:
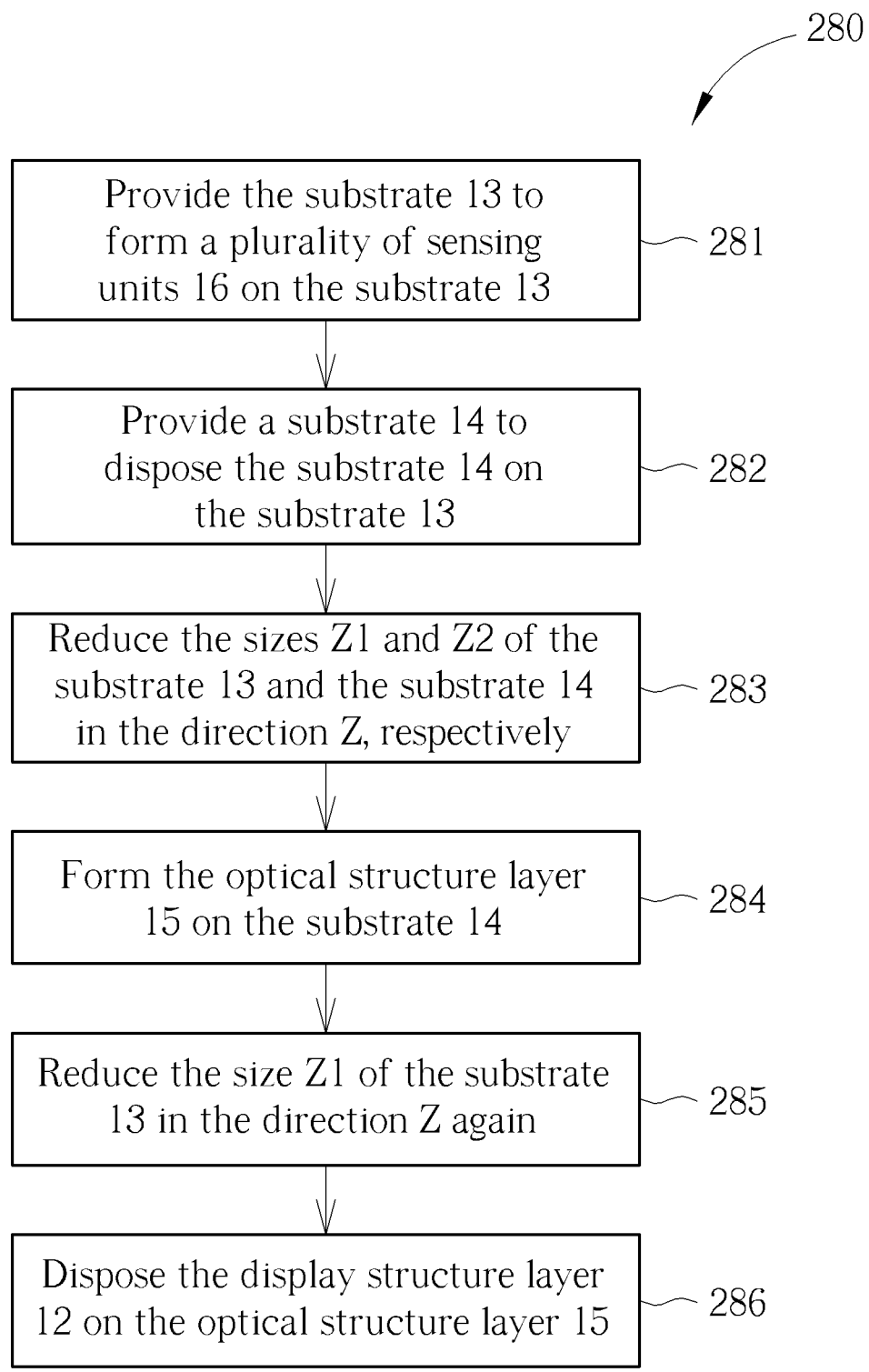
FIG. 2 is a schematic diagram of a manufacturing process according to an embodiment of the disclosure.

For illustrating a manufacturing method of the above electronic device 10 in detail, please refer to FIG. 2, which is a schematic diagram of a manufacturing process 280 according to an embodiment of the disclosure. The manufacturing process 280 may include following steps.

Step 281: Provide the substrate 13 to form a plurality of sensing units 16 on the substrate 13.

Step 282: Provide a substrate 14 to dispose the substrate 14 on the substrate 13.

Step 283: Reduce the size Z1 and the size Z2 of the substrate 13 and the substrate 14 in the direction Z, respectively.

Step 284: Form the optical structure layer 15 on the substrate 14.

Step 285: Reduce the size Z1 of the substrate 13 in the direction Z again.

Step 286: Dispose the display structure layer 12 on the optical structure layer 15.

In step 281, the substrate 13 is provided to form the plurality of sensing units 16 on the substrate 13. Please refer to FIG. 3 and FIG. 4 together. In one embodiment, steps of forming the sensing unit 16 include: disposing the sensing circuits 112 on the substrate 13, wherein one of the sensing circuits 112 includes a transistor 41, a transistor 42 and a transistor 43; disposing an insulating layer 215 on the sensing circuits 112; disposing an conductive layer 204 on the insulating layer 215; disposing a photosensitive layer 30 on the conductive layer 204; and disposing an conductive layer 206 on the photosensitive layer 30. Please refer to FIG. 4 again. In one embodiment, steps of disposing the photosensitive layer 30 on the conductive layer 204 include: forming a sub-photosensitive layer 31 on the conductive layer 204; forming a sub-photosensitive layer 32 on the sub-photosensitive layer 31; and forming a sub-photosensitive layer 33 on the sub-photosensitive layer 32.

In step 282, the substrate 14 is provided to form an alignment layer 222 on the substrate 14 and the substrate 14 is disposed on the substrate 13, wherein a medium layer 25 may further be included between the substrate 13 and the substrate 14, thereby increasing a fingerprint imaging distance to improve fingerprint recognition. In step 283, by reducing the size Z1 and the size Z2 of the substrate 13 and the substrate 14 in the direction Z, respectively, the thin design requirements may be met. In step 284, the optical structure layer 15 is formed on the substrate 14, and the substrate 14 is disposed between the substrate 13 and the optical structure layer 15. In step 281 to step 284, the substrate 13 and the substrate 14 are combined and then the optical structure layer 15 is formed on the substrate 14, wherein the substrate 14 is disposed between the substrate 13 and the optical structure layer 15, thereby enhancing alignment accuracy of the sensing units 16 and the optical structure layer 15 (which may be, for example, apertures 650 in FIG. 6 or FIG. 7) in the direction Z. In some embodiments, step 285 may further be selectively included. In step 285, by reducing the size Z1 of the substrate 13 in the direction Z again, the thin design requirement may be met. In step 286, the display structure layer 12 is disposed on the optical structure layer 15, and the manufacturing process 280 of the electronic device 10 is completed.

Figure 3:
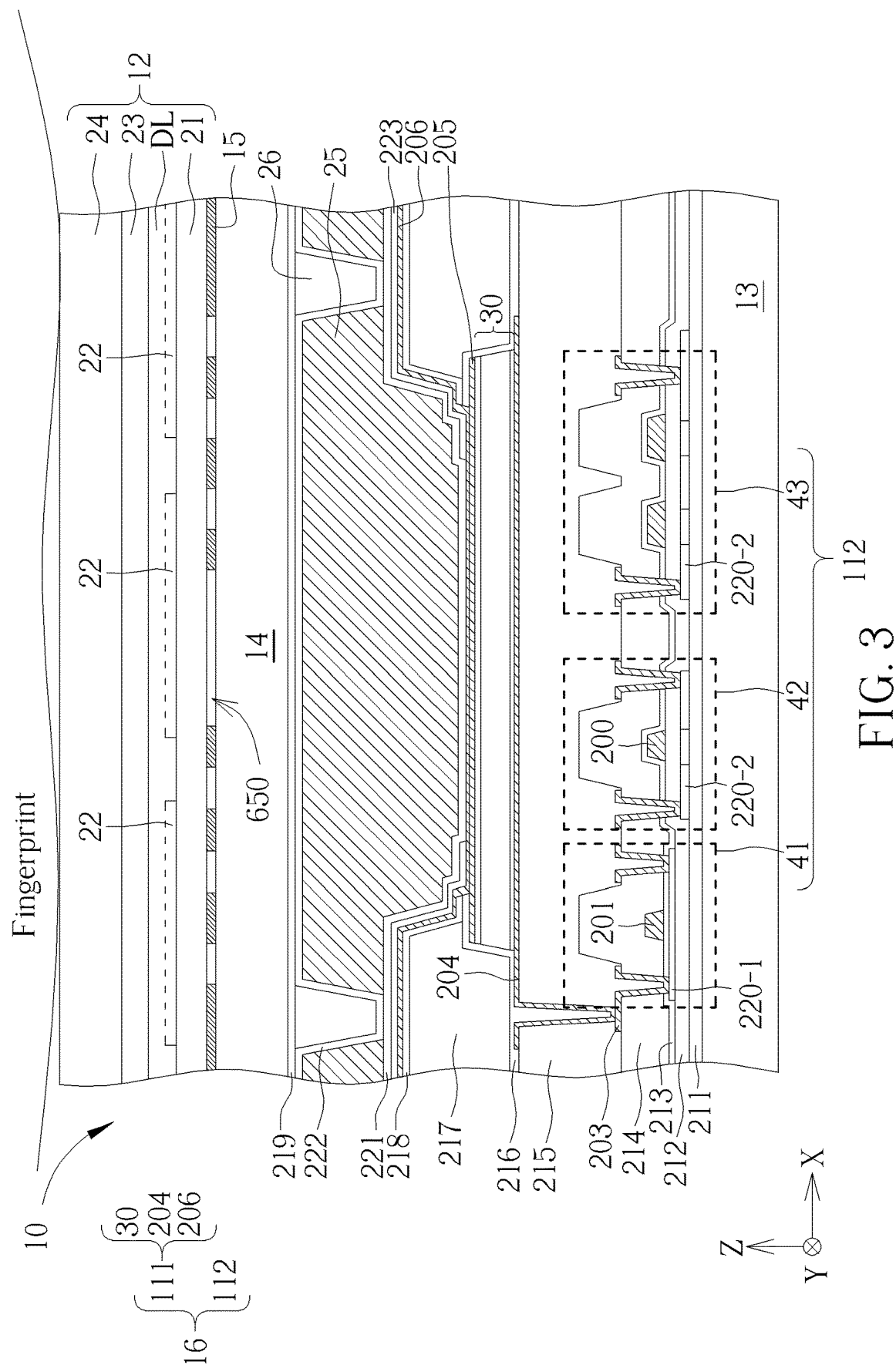
FIG. 3 is a schematic diagram of a detail cross-sectional view of the electronic device according to an embodiment of the disclosure.

FIG. 3 is a detailed stacking diagram of the electronic device 10 according to an embodiment of the disclosure. The display structure layer 12 may include a substrate 21, a display layer DL, an adhesive layer 23, and a protective layer 24. The substrate 21 and the protective layer 24 may be flexible material or inflexible material, and the materials may include plastic, glass, quartz, sapphire, ceramics, carbon fiber, and other suitable substrate materials, or combination of the above, but not limited to this. In some embodiments, the above plastic material may include polyimine (PI), Polyethylene terephthalate (PET), Polycarbonate (PC), other suitable materials, or a combination of the above, but not limited thereto. The substrate 21 may also be an insulating layer, for example, the substrate 21 may include an oxide layer, a nitride layer or other suitable insulating layers, or a combination of the above. The display layer may include a plurality of light-emitting units 22, and the plurality of light-emitting units 22 may include any type of display medium or light-emitting element, such as organic light-emitting diode (OLED), micro light-emitting diode (micro-LED), mini light emitting diode (mini-LED), quantum dot light emitting diode (QLED), nano wire LED or bar type LED, but not limited to this. The material of the adhesive layer 23 may include, for example, OCA (optical clear adhesive) or OCR (optical clear resin), but not limited to this. The adhesive layer 23 and the protective layer 24 can be selectively disposed. In some embodiments, the adhesive layer 23 and the protective layer 24 can be replaced by a encapsulation layer, and the encapsulation layer can provide functions of protection, packaging and/or planarization for the light-emitting unit. The encapsulation layer may include organic materials, inorganic materials, and combinations or mixtures of the above, but is not limited thereto. For example, the encapsulation layer may be a multilayer structure, and includes an inorganic layer, an organic layer, and an inorganic layer. The display structure layer 12 may further optionally include a color filter layer (not shown in FIG. 3) and a black matrix (not shown in FIG. 3) disposed on the light-emitting unit, but is not limited thereto.

The plurality of light-emitting units 22 are disposed on the substrate 21 and are between the adhesive layer 23 and the substrate 21. One of the plurality of light-emitting units 22 may be a red light-emitting unit, a green light-emitting unit or a blue light-emitting unit. Different light-emitting units can emit light of the same or different colors. The adhesive layer 23 is disposed on the plurality of light-emitting units 22, and between the plurality of light-emitting units 22 and the protective layer 24, and is utilized for combining the protective layer 24 and the plurality of light-emitting units 22. The protective layer 24 is disposed on the adhesive layer 23.

Between the substrates 14 and the substrates 13, there are a conductive layer 200, a conductive layer 201, a conductive layer 203, a conductive layer 204, a conductive layer 205 and a conductive layer 206, an insulating layer 211, an insulating layer 212, an insulating layer 213, an insulating layer 214, and an insulating layer 215, Insulating layer 216, insulating layer 217, insulating layer 218 and insulating layer 219, a semiconductor layer 220-1 and a semiconductor layer 220-2, an alignment layer 221 and an alignment layer 222, a light shielding layer 223, a medium layer 25, a photosensitive layer 30 and a plurality of spacing units 26.

The insulating layer 211 is disposed on the substrate 13, the insulating layer 212 is disposed on the insulating layer 211, the insulating layer 213 is disposed on the insulating layer 212, the insulating layer 214 is disposed on the insulating layer 213, and the insulating layer 215 is disposed on the insulating layer 214. The insulating layer 216 is disposed on the insulating layer 215, the insulating layer 217 is disposed on the insulating layer 216, the insulating layer 218 is disposed on the insulating layer 217, the conductive layer 206 is disposed on the insulating layer 218, and the light shielding layer 223 is disposed on the conductive layer 206, the alignment layer 221 is disposed on the light shielding layer 223 and the conductive layer 206, the insulating layer 219 is disposed on the substrate 14 and between the alignment layer 222 and the substrate 14. In one embodiment, the semiconductor layer 220-1 is disposed on the insulating layer 212, the conductive layer 201 is disposed on the semiconductor layer 220-1, the insulating layer 213 is disposed on the semiconductor layer 220-1, and the insulating layer 214 is disposed on the conductive layer 201. The conductive layer 203 is disposed on the insulating layer 214, the conductive layer 204 is disposed on the conductive layer 203 and the insulating layer 215, and the insulating layer 216 is disposed on the insulating layer 215 and the conductive layer 204. The conductive layer 203 is electrically connected to the semiconductor layer 220-1 and the conductive layer 204.

In one embodiment, the semiconductor layer 220-2 is disposed on the insulating layer 211, the insulating layer 212 is disposed on the semiconductor layer 220-2, the conductive layer 200 is disposed on the insulating layer 212, and the insulating layer 213 is disposed on the conductive layer 200. The conductive layer 203 is electrically connected to the semiconductor layer 220-2. The photosensitive layer 30 is disposed between the conductive layer 204 and the conductive layer 206, and the conductive layer 206 is disposed on the conductive layer 204. The medium layer 25 is disposed on the plurality of sensing units 16 and between the alignment layer 221 and the alignment layer 222. The alignment layer 221 is disposed between the medium layer 25 and the plurality of sensing units 16. The alignment layer 222 is disposed between the medium layer 25 and the substrate 14. The spacing units 26 are between the alignment layer 222 and the insulating layer 219. In some embodiments, the above-mentioned insulating layer may be a single layer or a multilayer structure. The material of the insulating layer may include, for example, an organic material or an inorganic material or a combination of the above, but is not limited thereto.

In one embodiment, the insulating layer 219 may be a filter layer, and the filter layer can filter out or block background light in a wavelength range, for example, between 450 nanometers and 580 nanometers. The filter layer can be, for example, coated with a color resist, a color filter film or an optically clear adhesive glue on the entire surface. The filter layer can be used to reduce the interference of the background light on the optical sensor to improve the sensitivity of the sensing component. In one embodiment, another filter layer can be selectively disposed between the substrate 14 and the substrate 13, for example, an infrared filter may be disposed on the insulating layer 219.

In one embodiment, the insulating layers 215 and 217 have a flattening function. The conductive layer 205 may comprise a transparent conductive material, such as indium tin oxide (ITO), but not limited thereto. The medium layer 25 is, for example, liquid crystal or other transparent materials, and is used to fill the space between the substrate 14 and the substrate 13, so that reflected light from a finger can penetrate the medium layer 25 and be detected by the sensing unit 16. Projections of the plurality of spacer units 26 and the photosensitive layer 30 on the XY plane may not overlap with each other.

Figure 4:
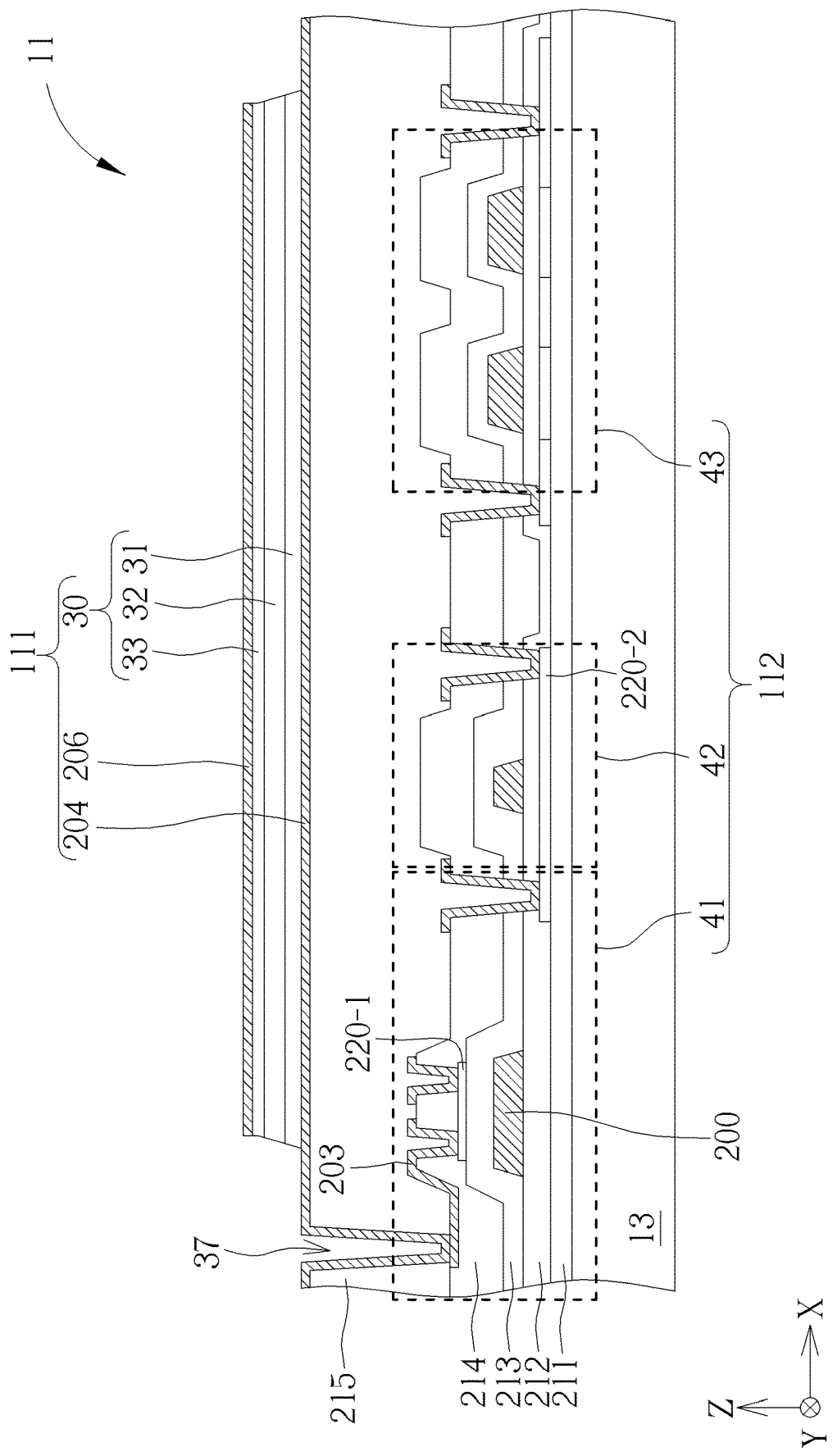
FIG. 4 is a schematic diagram of a cross-sectional view of a part of a light sensing panel according to an embodiment of the disclosure.

Please continue to refer to FIG. 4, which is a schematic diagram of a cross-section of a part of the light-sensing panel 11 according to an embodiment of the disclosure. Each sensing unit 16 includes a photodiode 111 and a sensing circuit 112. The photodiode 111 may include, for example, the photosensitive layer 30, at least a part of the conductive layer 204 (the conductive layer 204 is, for example, a lower electrode or an anode), and at least a part of the conductive layer 206 (the conductive layer 206 is, for example, an upper electrode or a cathode). In some embodiments, FIG. 4 is a partial schematic diagram of FIG. 3, but not limited thereto. The sensing circuit 112 is disposed on the substrate 13 and includes a transistor 41, a transistor 42 and a transistor 43. The photodiode 111 (for example, the photosensitive layer 30) is coupled to the sensing circuit 112 and is disposed on the sensing circuit 112. In this embodiment, the transistor 41 may be a thin film transistor with a top gate structure, and the material of the semiconductor layer 220-1 of the transistor 41 may include a metal oxide, such as indium gallium zinc oxide (IGZO).

In the above embodiment, the photosensitive layer 30 is disposed between the at least apart of the conductive layer 204 (the conductive layer 204 is, for example, a lower electrode or an anode) and the at least a part of the conductive layer 206 (the conductive layer 206 is, for example, an upper electrode or a cathode). In one embodiment, the conductive layer 205 in FIG. 3 can be omitted between the at least a part of the conductive layer 206 and the photosensitive layer 30 as shown in FIG. 4.

The photosensitive layer 30 may be a multilayer structure, and each layer can use materials with different energy gaps, to increase the sensing wavelength range of the photosensitive layer 30 and improve the light absorption efficiency. The material of the photosensitive layer 30 may include, for example, a silicon germanium (SiGe). In some embodiments, in a semiconductor process, a ratio of Silane gas (SiH4) and a monogermane gas (GeH4) can be adjusted to get silicon germanium with different energy gaps. A value of an energy gap "e" may be inferred or learned by material analysis, and a material analysis method may be, for example, X-ray photoelectron spectroscopy (XPS) analysis or energy-dispersive X-ray spectroscopy (EDS) analysis, but not limited to this.

The photosensitive layer 30 includes a sub-photosensitive layer 31 and a sub-photosensitive layer 32. The sub-photosensitive layer 31 is adjacent to the substrate 13 and has a first energy gap. The sub-photosensitive layer 32 is far away from the substrate 13 and has a second energy gap, wherein the first energy gap is greater than the second energy gap. In an embodiment, the sub-photosensitive layer 31 and the sub-photosensitive layer 32 are, for example, made of semiconductor materials; or, the sub-photosensitive layer 31 and the sub-photosensitive layer 32 are, for example, made of organic materials; or, the sub-photosensitive layer 31 is made of, for example, a semiconductor material, and the sub-photosensitive layer 32 is made of, for example, an organic material.

In one embodiment, the photosensitive layer 30 further includes a sub-photosensitive layer 33. The sub-photosensitive layer 32 is disposed between the sub-photosensitive layer 31 and the sub-photosensitive layer 33, and the photosensitive sub-layer 33 has a third energy gap, wherein the first energy gap is greater than the third energy gap and the second energy gap is greater than the third energy gap. In one embodiment, the sub-photosensitive layer 31, the sub-photosensitive layer 32, and the sub-photosensitive layer 33 are made of semiconductor materials; alternatively, the sub-photosensitive layer 31, the sub-photosensitive layer 32, and the sub-photosensitive layer 33 are made of organic materials. In this embodiment, the sub-photosensitive layer 32 may also be an N-type semiconductor material, a P-type semiconductor material, or a direct bandgap semiconductor material. The direct bandgap semiconductor material may include GaAs, GaN, InN, InP, GaSb, InAs or InSb, but not limited to this. The manufacturing materials of semiconductor materials and organic materials are illustrated in the following table as an example, but not limited to this.

TABLE

| | |
|---|---|
| Semiconductor material | Si (amorphous, polycrystalline, single crystal), Ge, GaAs, InP, CdTe, CdS |
| Organic material | P3HT, PCBM, ICBA, PEDOT: PSS |

In one embodiment, the insulating layer 215 is disposed between the photodiode 111 and the sensing circuit 112. The insulating layer 215 forms a plurality of openings 37. The sensing circuit 112 is connected to the conductive layer 204 via one of the plurality of openings 37. A projection of the photosensitive layer 30 in the XY plane is at least partially overlapped with projections of the conductive layer 204, the conductive layer 206 and the sensing circuit 112 in the XY plane. In other words, the photodiode 111 is disposed on the insulating layer 215, so that the size of the photodiode 111 in the direction Z is substantially equal, to improve the sensing efficiency of the photodiode 111.

Please continue to refer to FIG. 4, in one embodiment, the transistor 41 is a thin film transistor with a bottom gate structure, the conductive layer 200 is disposed on the insulating layer 212, and the insulating layer 213 is disposed on the conductive layer 200 and the insulating layer 212. The semiconductor layer 220-1 is disposed on the insulating layer 213, the insulating layer 214 is disposed on the insulating layer 213 and the semiconductor layer 220-1, the conductive layer 203 is disposed on the insulating layer 214, and the insulating layer 215 is disposed on the insulating layer 214 and the conductive layer 203, and the conductive layer 203 is electrically connected with the semiconductor layer 220-1 and the conductive layer 204. The material of the semiconductor layer 220-1 of the transistor 41 may be a metal oxide, such as Indium gallium Zinc oxide (IGZO), which reduces the leakage current, thereby improving sensitivity of the sensing element. In one embodiment, the transistor 42 may be a low temperature poly-silicon (LTPS) thin film transistor. In one embodiment, the transistor 43 is, for example, a double-gate thin film transistor.

Figure 5:
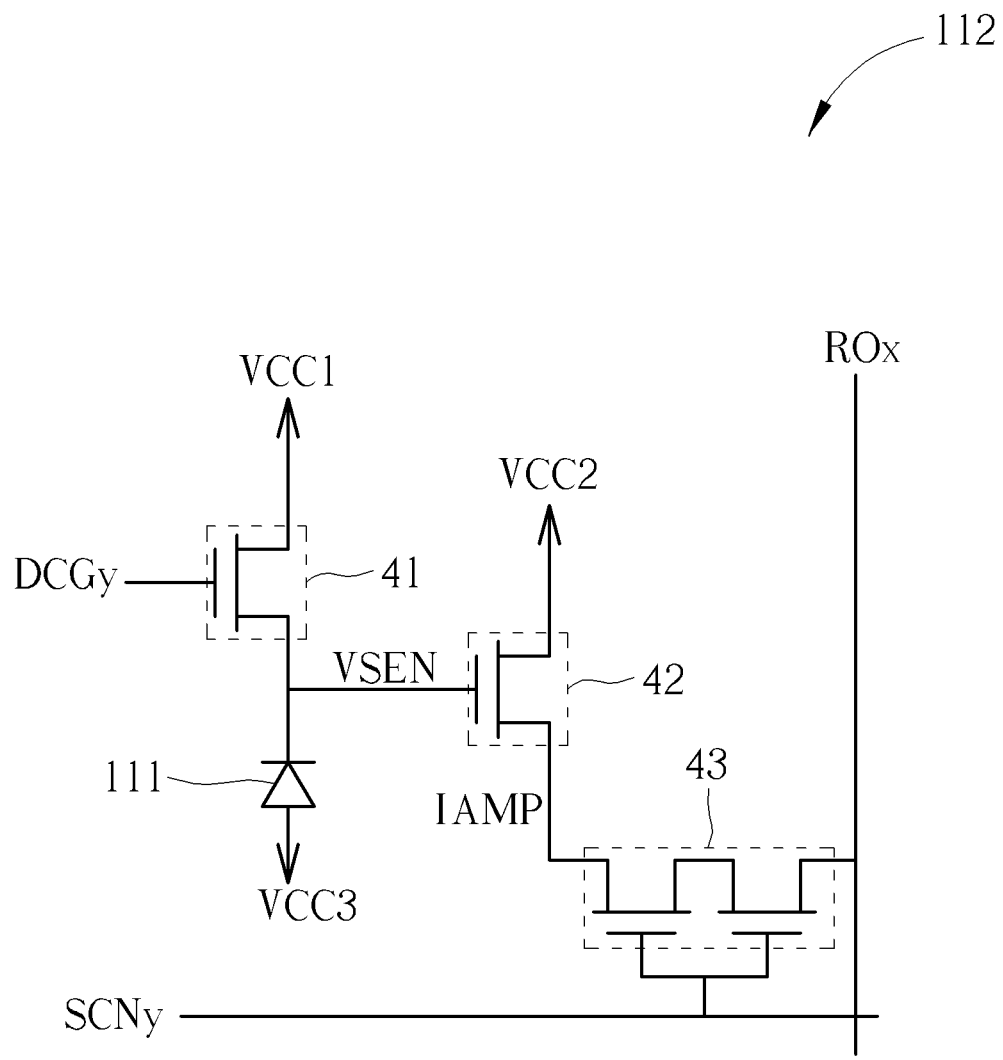
FIG. 5 is an equivalent circuit diagram of a sensing circuit and a light emitting diode according to an embodiment of the disclosure.

FIG. 5 is an equivalent circuit diagram of the sensing circuit 112 and the photodiode 111 according to an embodiment of the disclosure. The sensing circuit 112 includes a transistor 41, a transistor 42 and a transistor 43. The anode of the photodiode 111 is coupled to a system voltage line VCC3.

The transistor 41 includes a first terminal, coupled to a system voltage line VCC1; a second terminal, coupled to the cathode of the photodiode 111; and a control terminal, coupled to a control signal DCGy. The transistor 41 electrically connects or disconnects the cathode of the photodiode 111 and the system voltage line VCC1 according to the control signal DCGy. When the transistor 41 electrically connects the cathode of the photodiode 111 and the system voltage line VCC1, the sense voltage VSEN can be reset; when the transistor 41 electrically disconnects from the cathode of the photodiode 111 and the system voltage line VCC1, the sense voltage VSEN is not reset.

The transistor 42 includes a first terminal coupled to a system voltage line VCC2; a second terminal coupled to the first terminal of the transistor 43; and a control terminal coupled to the second terminal of the transistor 41 and the cathode of the photodiode 111. The transistor 42 amplifies the sensing voltage VSEN to generate an amplified current IAMP.

The transistor 43 includes a first terminal, coupled to the second terminal of the transistor 42; a second terminal, coupled to a readout signal line ROx; and a control terminal, coupled to the scan line signal SCNy. The first terminal of the transistor 43 is electrically connected to or disconnected from the readout signal line ROX according to a scanning line signal SCNy. When the first terminal of the transistor 43 is electrically connected to the readout signal line ROx, the amplified current IAMP can be output to the readout signal line ROx; when the first terminal of the transistor 43 is electrically disconnected from the readout signal line ROx, the amplified current IAMP is not output to the readout signal line ROx.

Assuming that the light sensing panel 11 includes m*n sensing units 16, m scanning lines SCN1 . . . SCNm, and n readout signal lines RO1 . . . ROn, then 1≤y≤m, 1≤x≤n, and x, y, m and n are positive integers. By collecting the amplified currents IAMP generated by the m*n sensing units 16, a fingerprint can be pieced together. The detailed operation of generating fingerprints by the light sensing panel 11 should fall within the scope of the prior art, and will not be narrated here.

Figure 6:
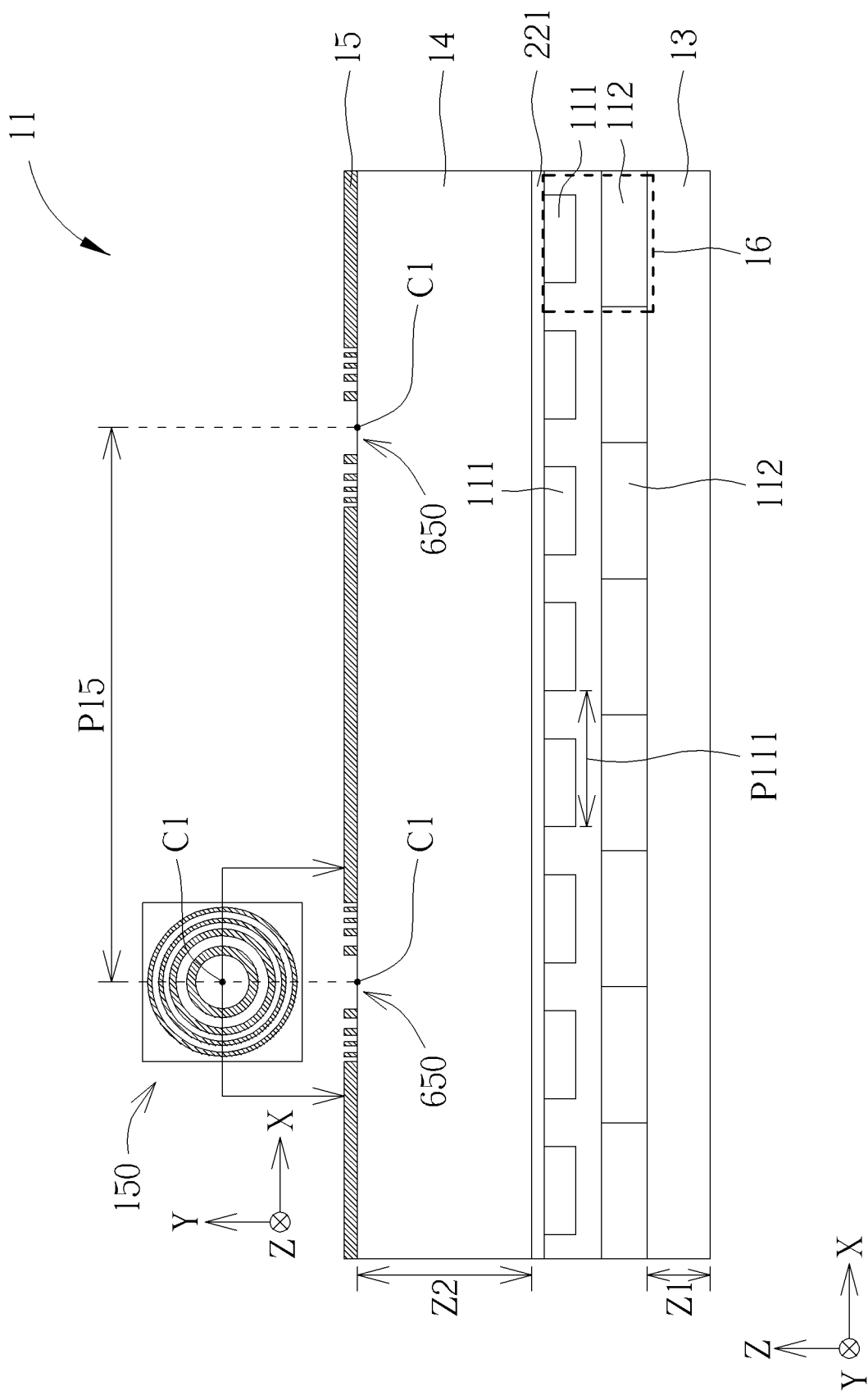
FIG. 6 is a schematic diagram of a light sensing panel according to an embodiment of the disclosure.

FIG. 6 is a schematic diagram of a light sensing panel 11 according to an embodiment of the disclosure. Differences between FIG. 6 and FIG. 1 are that some elements are omitted and a top view of a part of the optical structure layer 15 is illustrated. The optical structure layer 15 of the light sensing panel 11 may be formed with a plurality of concentric circular structures 150. In an embodiment, the concentric circular structures 150 may also include apertures 650. In one embodiment, in the direction X, a distance P15 between two adjacent concentric circular structures 150 may be, for example, greater than or equal to 300 micrometers, but is not limited to this. Those skilled in the art can select an appropriate distance P15 according to practical requirements. The distance P15 may be, for example, a distance from a center C1 of a concentric structure 150 to another center C1 of an adjacent concentric structure 150 in the direction X. In the direction Z, the concentric structure 150 at least partially overlaps the sensing unit 16 (for example, at least partially overlaps the photosensitive layer 30), or the center C1 of the concentric structure 150 at least partially overlaps the sensing unit 16 (for example, at least partially overlaps the photosensitive layer 30). In an embodiment, in the direction X, a distance Pi11 between two adjacent photodiodes 111 may be, for example, 25 micrometers to 100 micrometers, but is not limited thereto. A concentric circle structure may be, for example, a plurality of circular patterns having a same center on the optical structure layer 15, and the patterns may be formed by adjusting the thickness of the optical structure layer 15, for example.

Figure 7:
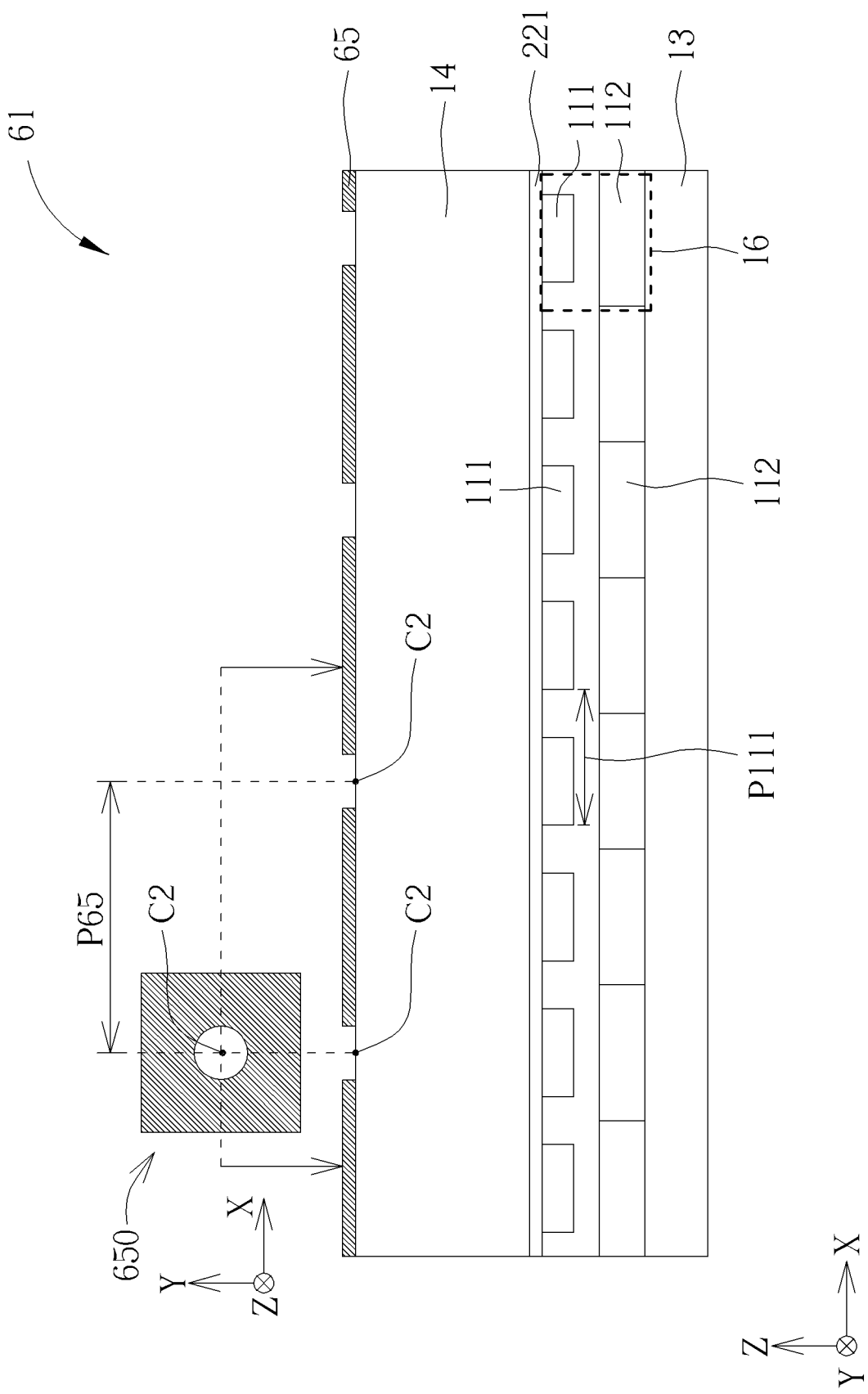
FIG. 7 is a schematic diagram of a light sensing panel according to another embodiment of the disclosure.

FIG. 7 is a schematic diagram of a light sensing panel 61 according to another embodiment of the disclosure. An optical structure layer 65 of the light sensing panel 61 is formed with a plurality of apertures 650. In one embodiment, in the direction X, a distance P65 between centers C2 of two adjacent apertures 650 is, for example, between 50 micrometers and 120 micrometers, or between 70 and 100 micrometers, but is not limited to this. Those skilled in the art can choose the appropriate distance P65 according to practical requirements. The distance P65 may be defined in a same way with the above-described distance P15, and is not narrated herein. In the direction Z, at least one of the plurality of apertures 650 at least partially overlaps the at least one sensing unit 16 (e.g. at least partially overlapping the photosensitive layer 30), thus improving imaging quality of the sensing unit 16.

Figure 8:
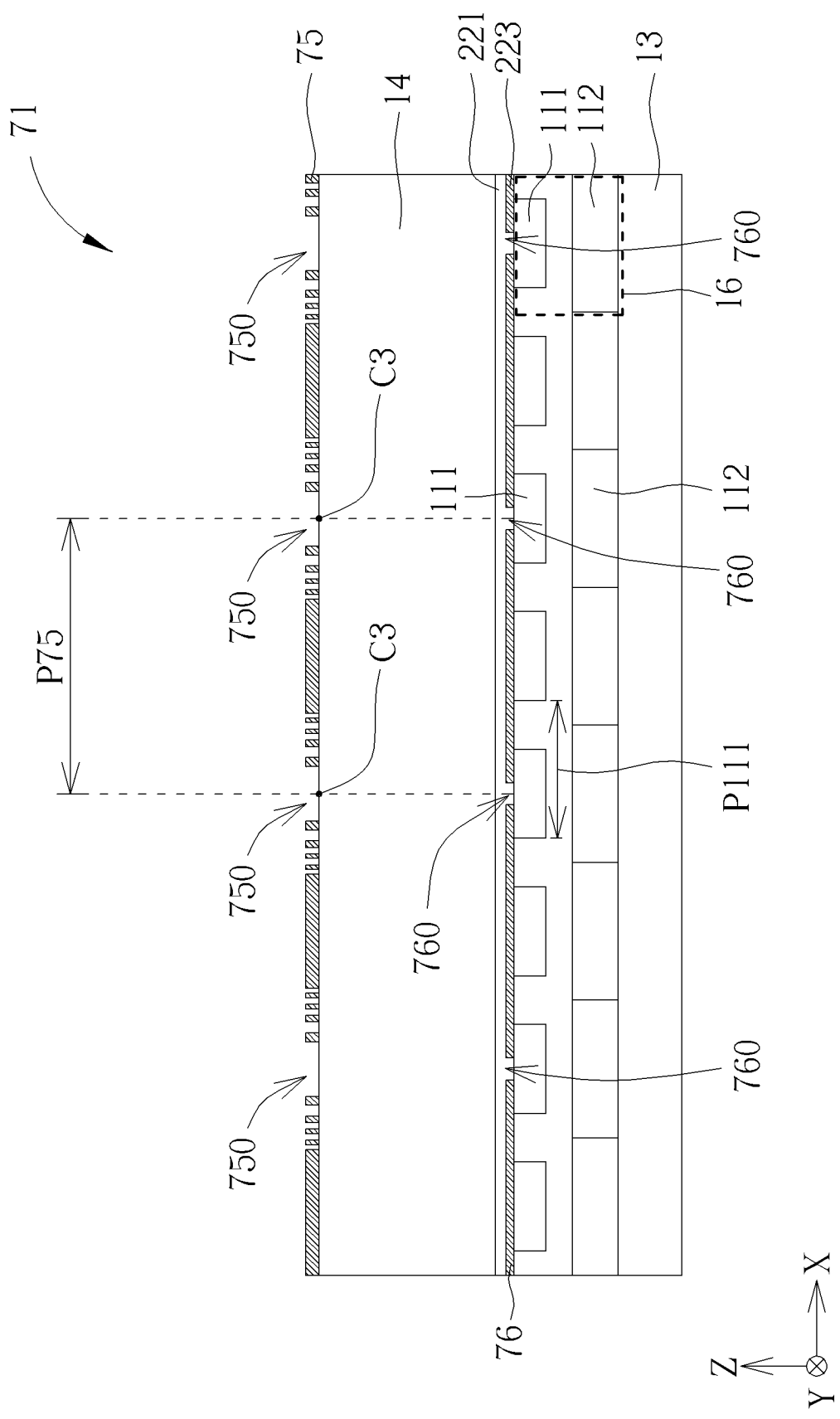
FIG. 8 is a schematic diagram of a light sensing panel according to another embodiment of the disclosure.

FIG. 8 is a schematic diagram of a light sensing panel 71 according to another embodiment of the disclosure. The light sensing panel 71 includes an optical structure layer 75 and an optical structure layer 76. The optical structure layer 75 and the optical structure layer 76 are respectively disposed on two sides of the substrate 14. The optical structure layer 75 is formed with a plurality of concentric circular structures 750. In an embodiment, in the direction X, a distance P75 between centers C3 of two adjacent concentric circular structures 750 may be, for example, 70 micrometers, but is not limited thereto. The distance P75 may be defined in a same way with the above-described distance P15, and is not narrated herein. In this embodiment, the optical structure layer 76 is formed with a plurality of apertures 760 disposed on the plurality of photodiodes 111, and between the optical structure layer 75 and the plurality of photodiode 111, or between the alignment layer 221 and the plurality of photodiodes 111. In some embodiments, the optical structure layer 76 may be a light shielding layer 223. In one embodiment, in the direction Z, centers of the at least one aperture 760 are disposed corresponding to the at least one photodiodes 111, so the imaging quality of the sensing unit 16 can be improved. In one embodiment, material of the optical structure layer 76 may be, for example, a light blocking material to reduce the interference light from being absorbed by the photodiode 111, to improve the signal to noise ratio (SNR). The optical structure layer 76 may include, for example, a lens, an aperture, or a combination of a lens, and an aperture, but is not limited thereto. The optical structure layer 76 can be formed by etching or a patterning process.

In summary, by respectively providing the substrate 13 and the substrate 14 and then combining the substrate 13 and the substrate 14, the disclosure increases the fingerprint imaging distance, to improve the sharpness of fingerprint imaging and manufacture an electronic device with fingerprint recognition function. Besides, by combining the substrate 13 and the substrate 14 first and then forming the optical structure layer, the disclosure further improves the alignment accuracy of the sensing unit and the aperture of the optical structure layer. The disclosure also provides a photodiode with a multiple photosensitive layer structure to improve the sensitivity of the photodiode (for example, increase the sensing wavelength range and improve the light absorption efficiency).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
 a display structure layer; and
 a light sensing panel, comprising;

a first substrate;

a second substrate, wherein the second substrate is disposed between the first substrate and the display structure layer;

a plurality of sensing units, disposed on the first substrate and between the first substrate and the second substrate;

an optical structure layer, disposed on the second substrate and between the second substrate and the display structure layer;

a medium layer, disposed on the plurality of sensing units;

a first alignment layer, disposed between the plurality of sensing units and the medium layer; and a second alignment layer, disposed between the second substrate and the medium layer.

2. The electronic device of claim 1, wherein the light sensing panel further comprises:

a first insulating layer, disposed between the second alignment layer and the second substrate;

wherein the first insulating layer is a filter layer.

3. The electronic device of claim 1, wherein at least one of the plurality of sensing units comprises:

a sensing circuit; and a photodiode, disposed on the sensing circuit, comprising: a photosensitive layer, coupled to the sensing circuit.

4. The electronic device of claim 3, wherein a material of the photosensitive layer comprises a semiconductor material, an organic material, or a combination of the semiconductor material and the organic material.

5. The electronic device of claim 3, wherein the sensing circuit further comprises:

a transistor, coupled to the photodiode, comprising a semiconductor layer, wherein the semiconductor layer is an oxide semiconductor.

6. The electronic device of claim 1, wherein at least one of the plurality of sensing units comprises a photosensitive layer, and the photosensitive layer comprises:

a first sub-photosensitive layer, adjacent to the first substrate and having a first energy gap; and a second sub-photosensitive layer, away from the first substrate, and having a second energy gap;

wherein the first energy gap is greater than the second energy gap.

7. The electronic device of claim 6, wherein the photosensitive layer further comprises:

a third sub-photosensitive layer, having a third energy gap, wherein the second sub-photosensitive layer is disposed between the first sub-photosensitive layer and the third sub-photosensitive layer;

wherein the first energy gap is greater than the third energy gap, and the second energy gap is greater than the third energy gap.

8. The electronic device of claim 1, wherein the optical structure layer comprises a plurality of concentric circular structures in a top view.

9. The electronic device of claim 1, wherein the optical structure layer comprises a lens, an aperture, or a combination of a lens and an aperture.

10. A manufacturing method for an electronic device, comprising:

providing a first substrate, to form a plurality of sensing units on the first substrate;

providing a medium layer disposed on the plurality of sensing units;

providing a first alignment layer disposed between the plurality of sensing units and the medium layer;

providing a second substrate, to dispose the second substrate on the first substrate;

providing a second alignment layer disposed between the second substrate and the medium layer;

forming an optical structure layer on the second substrate, wherein the second substrate is disposed between the plurality of sensing units and the optical structure layer; and disposing a display structure layer on the optical structure layer.

11. The manufacturing method of claim 10 further comprising:

providing a first insulating layer disposed between the second alignment layer and the second substrate;

wherein the first insulating layer is a filter layer.

12. The manufacturing method of claim 10 further comprising:

providing a sensing circuit;

providing a photodiode disposed on the sensing circuit, wherein the photodiode comprises:

a photosensitive layer coupled to the sensing circuit.

13. The manufacturing method of claim 12, wherein a material of the photosensitive layer comprises a semiconductor material, an organic material, or a combination of the semiconductor material and the organic material.

14. The manufacturing method of claim 12 further comprising:

providing a transistor, coupled to the photodiode, comprising a semiconductor layer, wherein the semiconductor layer is an oxide semiconductor.

15. The manufacturing method of claim 10, wherein at least one of the plurality of sensing units comprises a photosensitive layer, and the photosensitive layer comprises:

a first sub-photosensitive layer adjacent to the first substrate and having a first energy gap; and a second sub-photosensitive layer away from the first substrate, and having a second energy gap;

wherein the first energy gap is greater than the second energy gap.

16. The manufacturing method of claim 15, the photosensitive layer further comprising:

a third sub-photosensitive layer, having a third energy gap, wherein the second sub-photosensitive layer is disposed between the first sub-photosensitive layer and the third sub-photosensitive layer;

wherein the first energy gap is greater than the third energy gap, and the second energy gap is greater than the third energy gap.

17. The manufacturing method of claim 10, wherein the optical structure layer comprises a plurality of concentric circular structures in a top view.

18. The electronic device of claim 10, wherein the optical structure layer comprises a lens, an aperture, or a combination of a lens and an aperture.

* * * * *